United States Patent
Katz et al.

(10) Patent No.: US 10,122,057 B2
(45) Date of Patent: Nov. 6, 2018

(54) BANDWIDTH INCREASE METHOD FOR DIFFERENTIAL PASSIVE ELEMENTS

(71) Applicant: International Business Machines Corporation, Armonk, NY (US)

(72) Inventors: Oded Katz, Haifa (IL); Run Levinger, Tel Aviv (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 55 days.

(21) Appl. No.: 15/275,399

(22) Filed: Sep. 25, 2016

(65) Prior Publication Data
US 2018/0090806 A1   Mar. 29, 2018

(51) Int. Cl.
H03H 7/42 (2006.01)
H01P 3/02 (2006.01)
H03H 5/00 (2006.01)

(52) U.S. Cl.
CPC ............. *H01P 3/02* (2013.01); *H03H 7/42* (2013.01)

(58) Field of Classification Search
CPC ........ H05K 2201/09236; H05K 1/0219; H01P 3/08; H03H 7/42
USPC ..................................... 333/1, 4, 25, 238, 26
See application file for complete search history.

(56) References Cited

U.S. PATENT DOCUMENTS

| | | | |
|---|---|---|---|
| 6,950,590 B2 * | 9/2005 | Cheung | H01P 3/003 385/129 |
| 7,259,625 B2 * | 8/2007 | Sanderson | H01F 17/0006 257/528 |
| 7,605,672 B2 * | 10/2009 | Kirkeby | H01P 5/10 333/112 |
| 7,847,653 B2 | 12/2010 | Meharry | |
| 8,264,300 B2 * | 9/2012 | Cisco | H01P 9/00 333/161 |
| 8,427,388 B2 * | 4/2013 | Fahs | H01F 17/0006 333/25 |
| 8,502,620 B2 * | 8/2013 | Lu | H01F 21/12 333/246 |
| 8,559,186 B2 * | 10/2013 | Jin | H01F 17/0006 174/524 |
| 8,575,731 B2 | 11/2013 | Ujita et al. | |
| 8,629,741 B2 * | 1/2014 | Cho | H01P 1/2013 333/1 |
| 2013/0112465 A1 | 5/2013 | Duvanenko | |

(Continued)

OTHER PUBLICATIONS

Paul Biggins., "Wideband Balun Design with Ferrite Cores", DigitalCommons@CalPoly discovery, Senior Project California Polytechnic State University, San Luis Obispo, Jun. 21, 2014.

(Continued)

*Primary Examiner* — Dean Takaoka
(74) *Attorney, Agent, or Firm* — Suzanne Erez

(57) ABSTRACT

This invention relates to assemblies and processes for increasing the bandwidth of differential passive elements. The use of a floating plane in differential transmission lines is disclosed. One such assembly is a broadband balun having high even mode effective impedance, thus degrading the even-mode propagation or matching, and maintaining the desired odd mode effective impedance. Other assemblies can include line couplers, hybrid couplers, RF chokes with back-to-back baluns, and other elements, such as balanced filters.

19 Claims, 10 Drawing Sheets

(56) References Cited

U.S. PATENT DOCUMENTS

2013/0321116 A1* 12/2013 Tiemeijer ............ H01F 27/2804
336/200
2014/0028521 A1    1/2014 Bauder et al.
2014/0118963 A1*  5/2014 Lenive ................ H01L 23/5225
361/748

OTHER PUBLICATIONS

XueShi Li et al., "Metamaterial Extends Patch Antenna Bandwidth", Microwaves and RF, May 6, 2015.

* cited by examiner

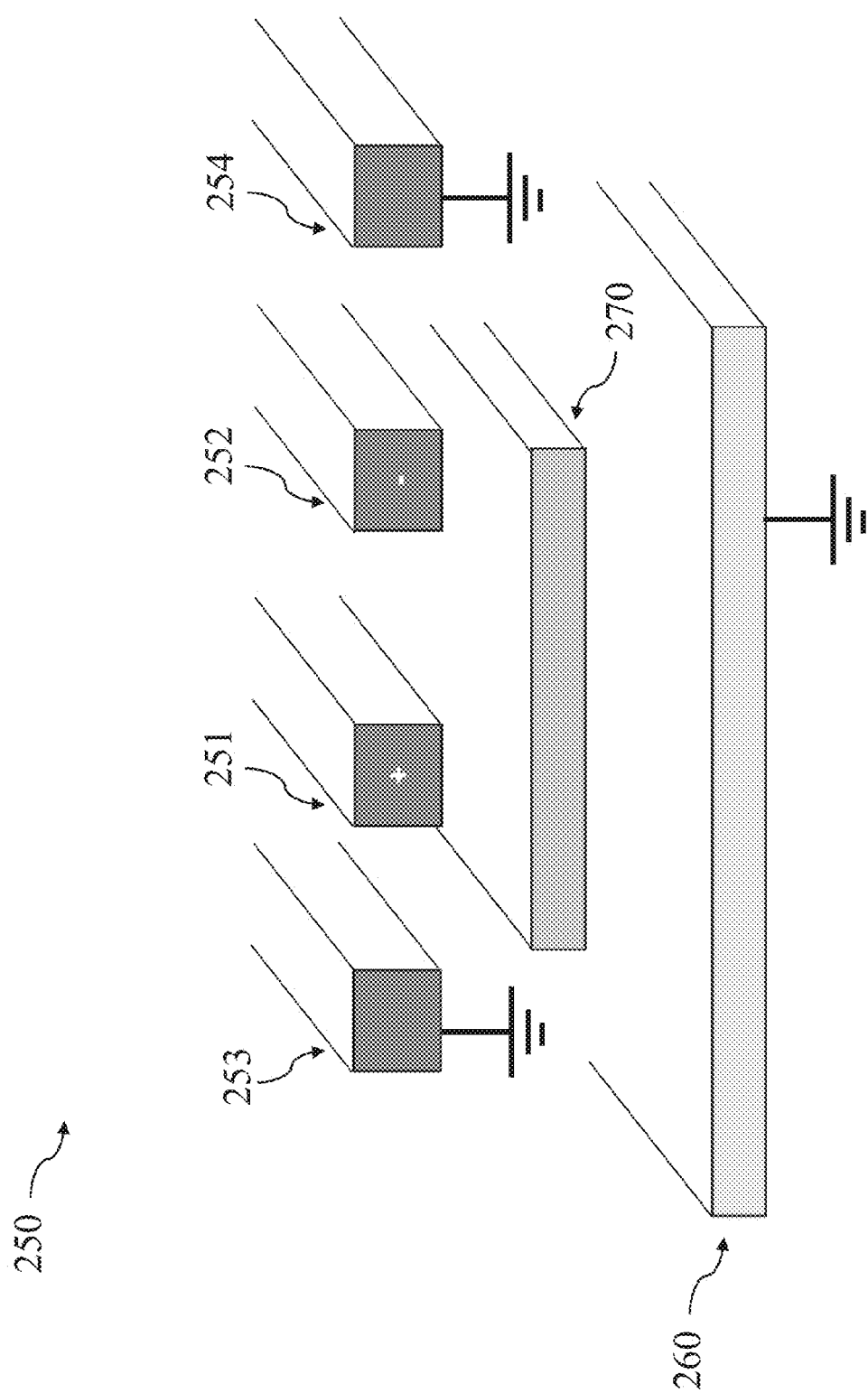

BANDWIDTH INCREASE METHOD FOR DIFFERENTIAL PASSIVE ELEMENTS

FIELD OF TECHNOLOGY

The present invention relates to the technical field of passive microwave devices. More particularly, the present invention is in the field of differential passive elements based on transmission-lines having wide bandwidths.

BACKGROUND OF THE INVENTION

Current trends in microwave electronics have created the need for high frequency and wide bandwidth elements fabricated with integrated circuit technology. Such elements are typically based on transmission line structures. Transmission-line structures are characterized by their characteristic impedance or effective impedance, which determines matching to other structures, and their wave propagation. The effective impedance value is relativity constant over a wide frequency range. One approach to transmission line structures is the use of differential elements.

Differential elements employ balanced transmission line structures as can be seen in FIG. 1A and FIG. 1B. The conventional balanced transmission line structures 100 (FIG. 1A) consists of a top metal layer for the positive line 101 and negative signal line 102, and a bottom metal layer for the ground plane 110. Additionally, a side-shielded balanced transmission line structure 150 (FIG. 1B), consists of a top metal layers for the positive signal line 151, negative signal line 152, a bottom metal layer for the ground plane 160, and the positive signal line side grounded side-shield 153 and negative signal line side grounded side-shield 154.

Differential transmission line structures have an odd-mode effective impedance and an even-mode effective impedance. Typically, the odd-mode effective impedance and the even-mode effective impedance values are similar. However, in balanced elements, it is desired to have an improved properties (e.g. propagation or matching) of the differential signal (odd-mode), and degraded properties for the common signal (even-mode), in order to have good common mode rejection ratio (CMRR).

A balanced element based on differential transmission lines that would have high even-mode effective impedance (thus degrading the even-mode propagation or matching), and would maintain the desired odd-mode effective impedance, would show good differential properties (CMRR) over a wide frequency bandwidth.

There are several passive structures that are based on differential transmission lines, such as line couplers, lange couplers, hybrid couplers, parallel coupled line filters.

Another example for such a structure is the Marchand balun, which is generally used to convert unbalanced transmission line inputs into one or more balanced transmission line outputs or vice versa. The Marchand balun consist of coupled half-wavelength and two quarter-wavelength transmission line structures. Its operation is determined according to usable wavelengths, thus its frequency band is fundamentally narrow.

Other design schemes have been attempted to create wide bandwidth RF passive devices. These approaches include differential transmission lines with slow waves, which creates asymmetry between the even-mode and odd-mode effective impedance but they are very hard to simulate correctly, and therefore implement in integrated circuits. Another approach is the artificial transmission lines that can achieve greater bandwidths but require larger area, exhibits a ripple in its frequency response, and needs complex design.

Thus, a method for increasing bandwidth of differential passive elements is needed.

SUMMARY OF INVENTION

This summary is provided with the understanding that it will not be used to limit the scope or meaning of the claims.

In an embodiment, the apparatus comprises a ground plane, a differential transmission line, and a floating plane below the differential transmission line. The differential transmission line and the floating plane can be configured to create a cross parasitic capacitance at an odd mode and reduce the odd mode effective impedance.

In embodiments, an apparatus comprises an apparatus comprises a first ground plane, a positive signal line, a negative signal line, and a first floating plane between the signal lines and the first ground plane. In an optional embodiment, the positive signal line, the negative signal line, and the floating plane are configured to create a cross parasitic capacitance at an odd mode and reduce the odd mode effective impedance. In an alternative embodiment, the apparatus further comprises a grounded side shield line that is coplanar with the positive signal line and/or the negative signal line. In a preferred embodiment the first signal line comprises copper. In a further preferred embodiment, the apparatus further comprises a silicon substrate layer below the first ground plane. In an optional embodiment, the apparatus of further comprises a dielectric substrate between the first ground plane and the positive signal line, and that dielectric substrate can be selected from the group consisting of ceramic, plastic, polymer, and synthetic fiber. In an alternative embodiment, the apparatus further comprises a second ground plane above the positive signal line and a second floating plane between the positive signal line and the second ground plane. In an optional embodiment, the floating plane located below the signal lines co-planar to the ground plane.

In further embodiments, a balun comprises a substrate layer, a ground plane formed on a first surface of the substrate layer, a first signal line having a first end connected to a first port and second end connected to a second port, a second signal line having a third end connected to the ground plane a second port and a fourth end connected to the ground plane, a third signal line having a fifth end connected to the ground plane and a sixth end connected to a third port, and a floating plane located either between the signal lines and the ground plane, or below the signal lines co-planar to the ground plane.

Numerous other embodiments are described throughout herein. All of these embodiments are intended to be within the scope of the invention herein disclosed. Although various embodiments are described herein, it is to be understood that not necessarily all objects, advantages, features or concepts need to be achieved in accordance with any particular embodiment. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

The methods and systems disclosed herein may be implemented in any means for achieving various aspects, and may be executed in a form of a machine-readable medium embodying a set of instructions that, when executed by a machine, cause the machine to perform any of the operations disclosed herein. These and other features, aspects, and advantages of the present invention will become readily apparent to those skilled in the art and understood with reference to the following description, appended claims, and accompanying figures, the invention not being limited to any particular disclosed embodiment(s).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and the invention may admit to other equally effective embodiments.

FIG. 2B illustrates a differential transmission-line 3 metal layer structure with side ground lines and a floating plane, according to an embodiment of the present invention.

FIG. 3A illustrates a differential transmission-line 2 metal layer structure with side ground lines and a floating plane, according to an embodiment of the present invention.

Other features of the present embodiments will be apparent from the Detailed Description that follows.

DETAILED DESCRIPTION OF THE EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention. Electrical, mechanical, logical and structural changes may be made to the embodiments without departing from the spirit and scope of the present teachings. The following detailed description is therefore not to be taken in a limiting sense, and the scope of the present disclosure is defined by the appended claims and their equivalents.

Figure 1A:
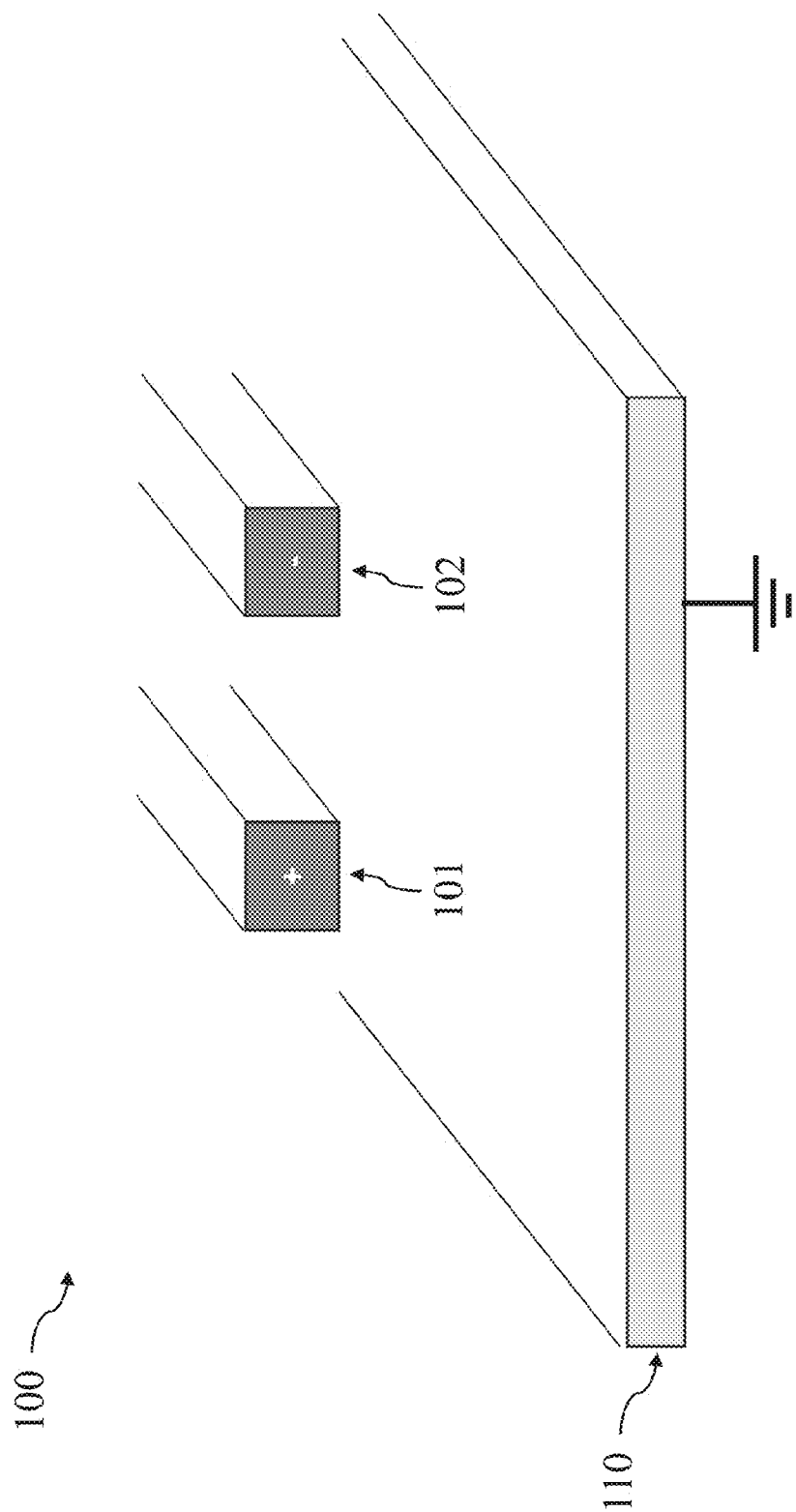
FIG. 1A illustrates a differential transmission-line structure.
Figure 1B:
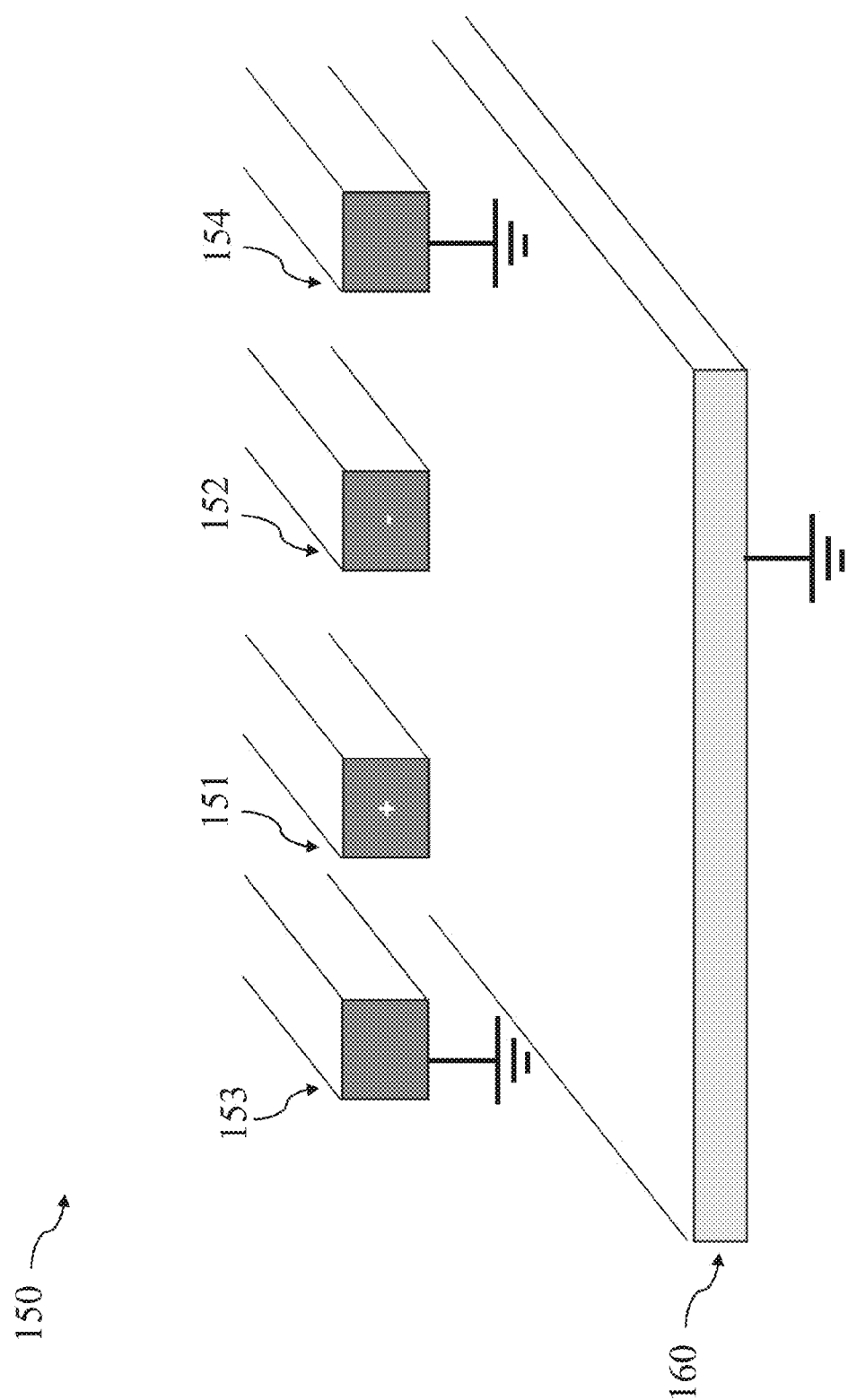
FIG. 1B illustrates a differential transmission-line structure with side ground lines.
Figure 2A:
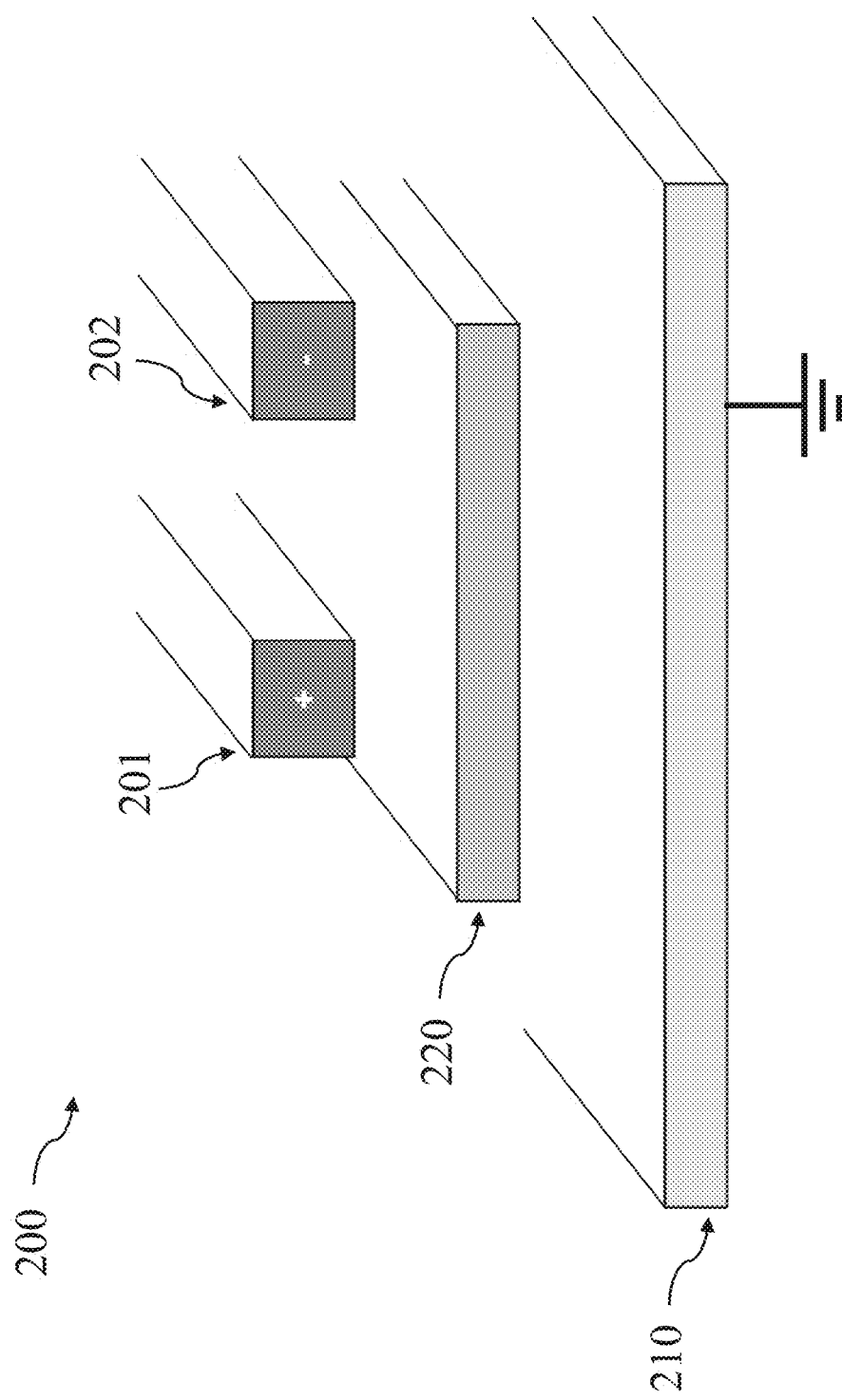
FIG. 2A illustrates a differential transmission-line 3 metal layer structure with a floating plane, according to an embodiment of the present invention.

FIG. 2A illustrates a side-shielded balanced transmission-line structure 200 consisting of top metal layer for the positive signal line 201 and negative signal line 202 and a ground plane 210 at a bottom metal layer, according to an embodiment of the present invention. In addition, a floating plane 220 is present at an intermediate metal layer below the signal lines. The structure can be fabricated using common silicon processing techniques, such as photolithography. The structure 200 can be free standing with air or vacuum between the lines and planes. Support structures can also be fabricated to provide mechanical support. In this configuration, the positive signal line, the negative signal line, and the floating plane are configured to create a cross parasitic capacitance at an odd mode. The odd mode can be attenuated by 1 dB or more from such a configuration. The structure may be fabricated on a silicon substrate below the ground plane. The signal lines may comprise any conductive material, such as copper, aluminum, or alloys. A dielectric substrate may be placed between the first ground plane and the signal lines. This dielectric substrate can be, as examples, ceramic, plastic, polymer, or synthetic fiber.

Similarly, 2B illustrates a side-shielded balanced transmission-line structure 250, according to an embodiment of the present invention. However, in addition to the positive signal line 251 and negative signal line 252 a ground plane 260, and a floating plane 270, the structure 250 comprises a grounded side shield 253 and 254 lines at the top metal layer. The side shield helps to isolate the signal from other elements that are in the plane of the transmission line.

Figure 3A:
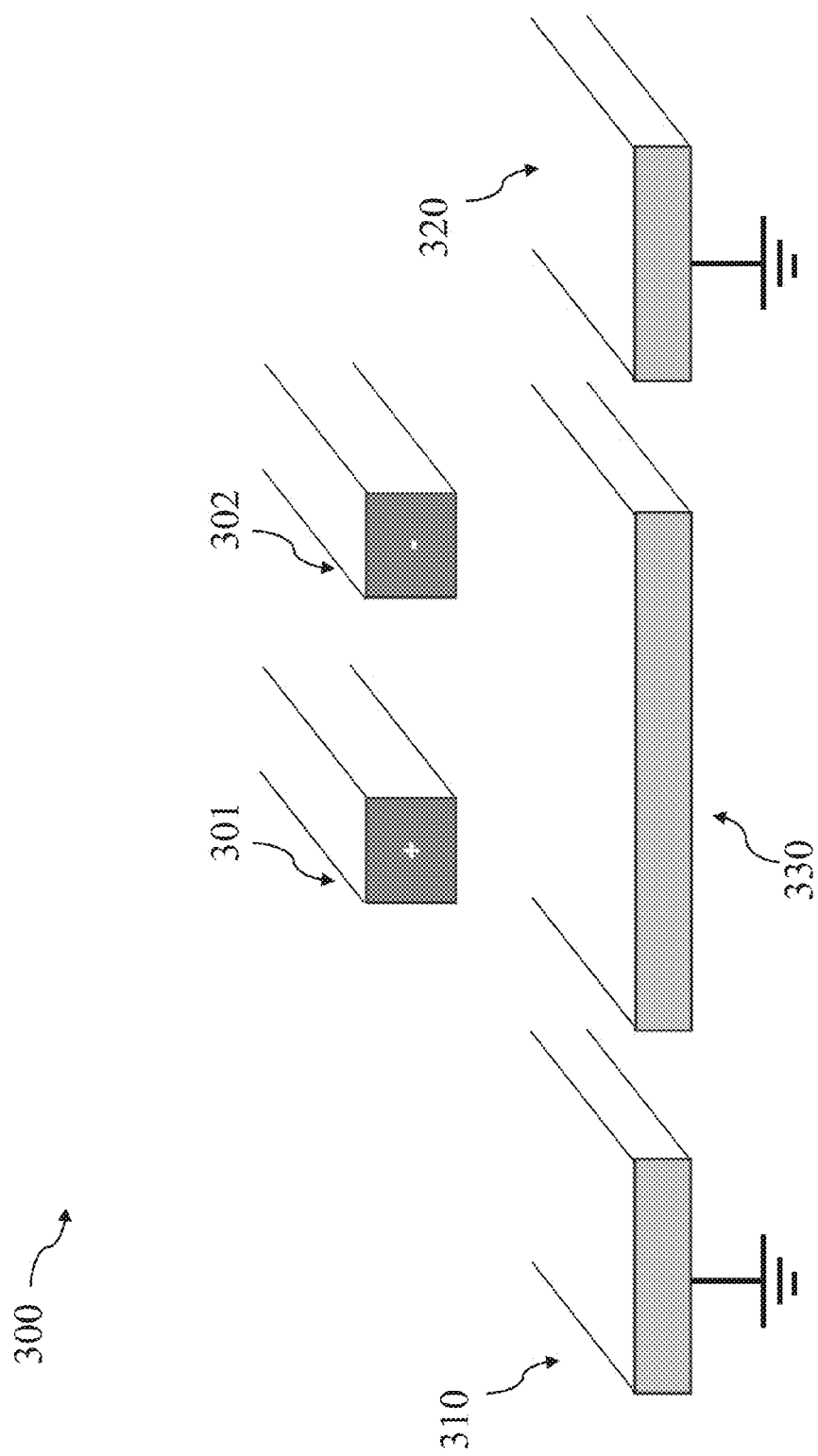
FIG. 3A illustrates a differential transmission-line 2 metal layer structure with a floating plane, according to an embodiment of the present invention.

FIG. 3A illustrates a side-shielded balanced transmission-line structure 300 consisting of top metal layer for the positive signal line 301 and negative signal line 302, according to an embodiment of the present invention. In addition, two ground planes 310, 320 at a bottom metal layer and a floating plane 330 are present at bottom metal layer below the signal lines. The structure can be fabricated using common silicon processing techniques, such as photolithography. The structure 300 can be free standing with air or vacuum between the lines and planes. Support structures can also be fabricated to provide mechanical support.

Figure 3B:
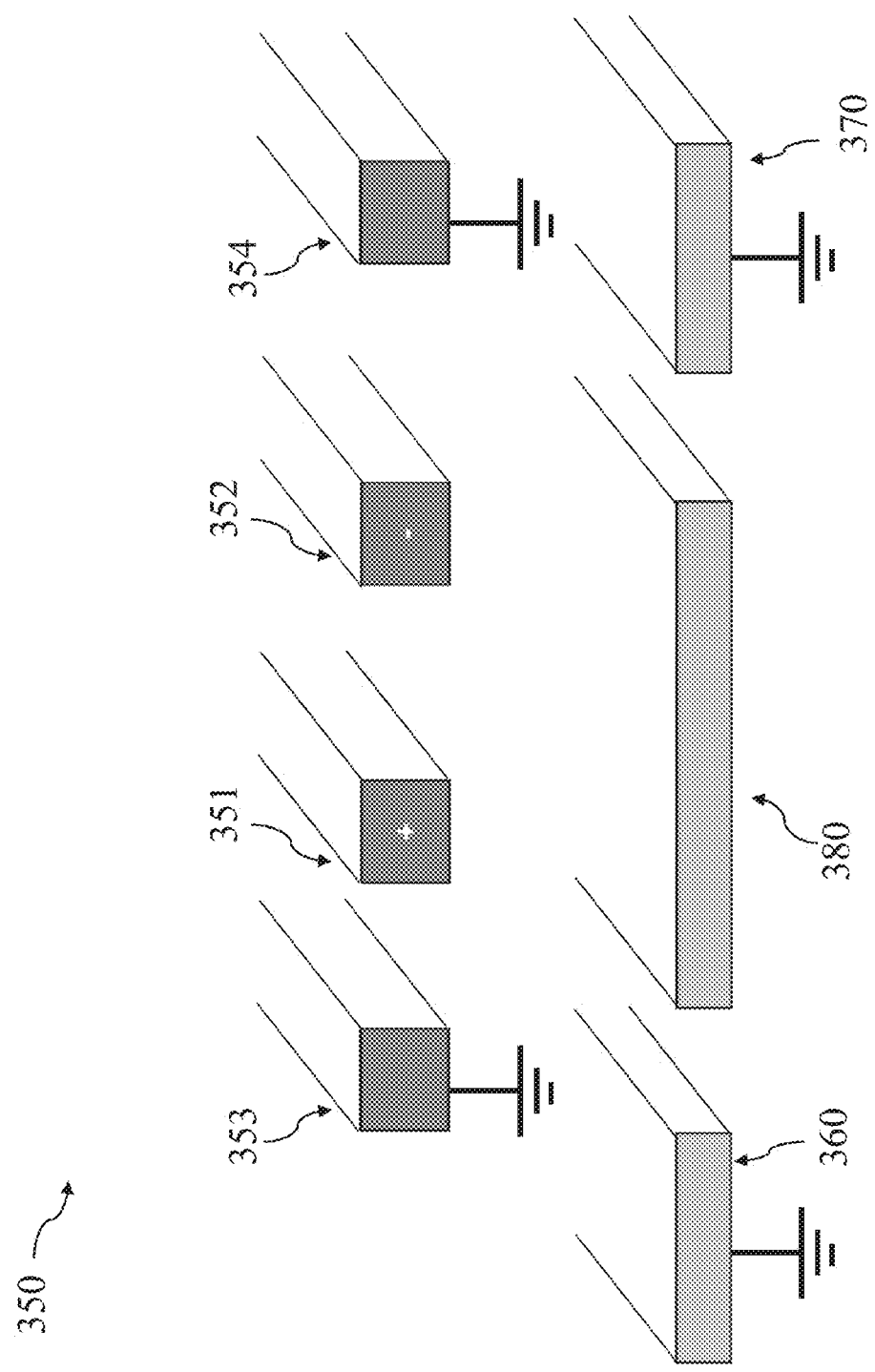

Similarly, FIG. 3B illustrates a side-shielded balanced transmission-line structure 350, according to an embodiment of the present invention. However, in addition to the positive signal line 351 and negative signal line 352 a ground plane 360, and a floating plane 370, the structure 350 comprises a grounded side shield 353 and 354 lines at the top metal layer. The side shield help to isolate the signal from other elements that are in the plane of the transmission line. The ground plane is implemented at the bottom metal layer below the side shield lines, and the floating plane is also implemented at the bottom metal layer below the signal lines.

Figure 4A:
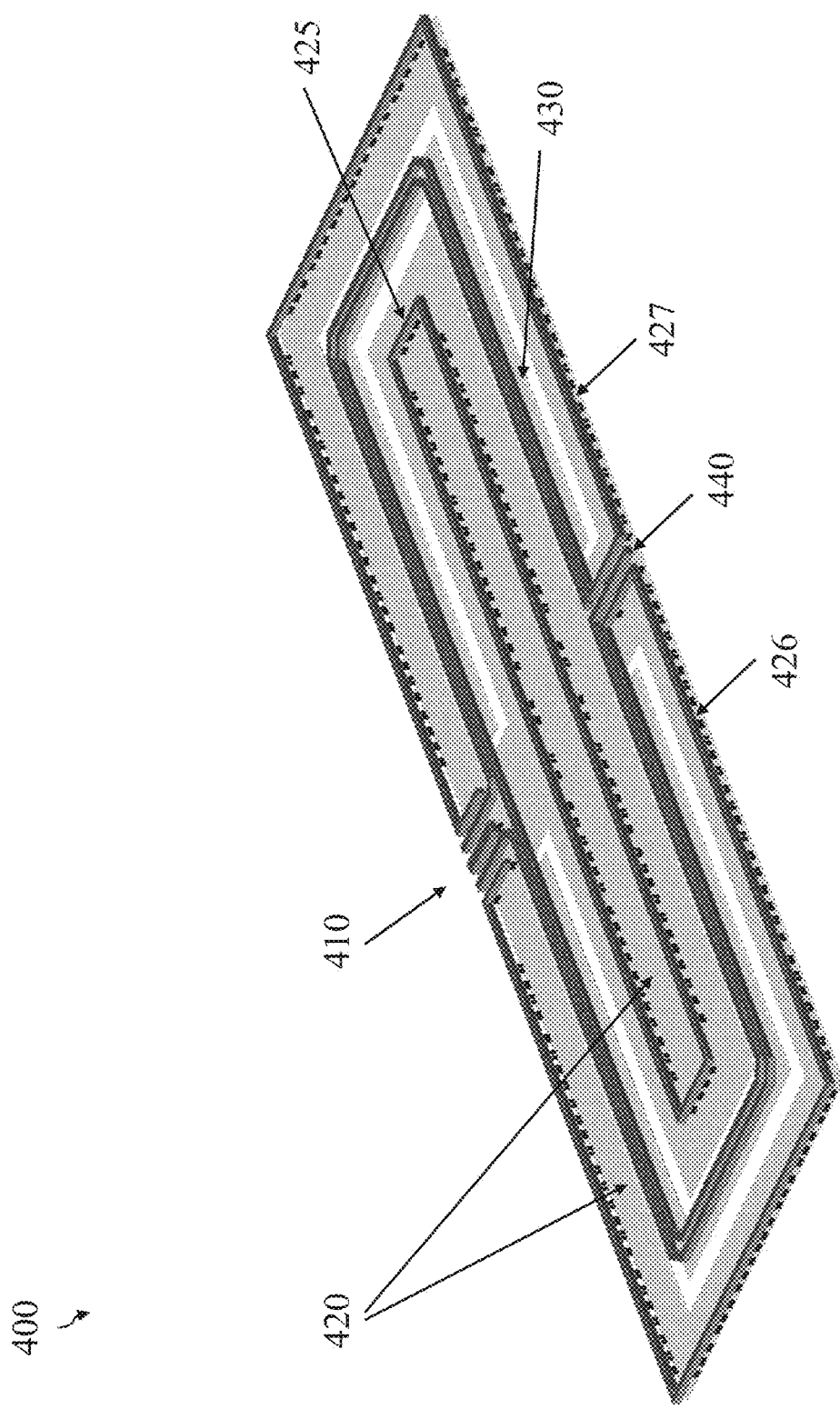
FIG. 4A illustrates a perspective view of a planar Marchand transmission line structure, according to an embodiment of the present invention.

FIG. 4A illustrates a perspective view of a planar Marchand transmission line structure 400, according to an embodiment of the present invention. This structure is designed to have a high effective impedance. The device has differential port 410 having two λ/4 lines connected to ground on the other side and a single-ended port 440 having a λ/2 line with an open on the other side. Typically differential transmission-line structures have similar odd and even mode effective impedance. A structure can be designed that has a high even mode effective impedance, degrading the even-mode propagation or matching, and maintains the desired odd mode effective impedance. To achieve this, a floating (MQ) plane 430 is inserted below the differential transmission-line (AM). Under the rest of the structure, there is a ground plane (MQ) 420. The floating plane 430 does not affect the even mode impedance but reduces the odd-mode impedance. This arrangement creates a cross parasitic capacitance at odd mode, and reduces the odd mode effective impedance.

Furthermore, the plane generates a "pure" differential signal at the output and eliminates the common mode signal. This matching behavior based on effective impedance is intrinsically wide band. Since the effective impedance is less sensitive to operating frequency than the transmission line structure length, it results in a wide band balun. The device may also have side shields present, as shown by the inner side shield 425 and the outer side shields 426, 427.

Figure 4B:
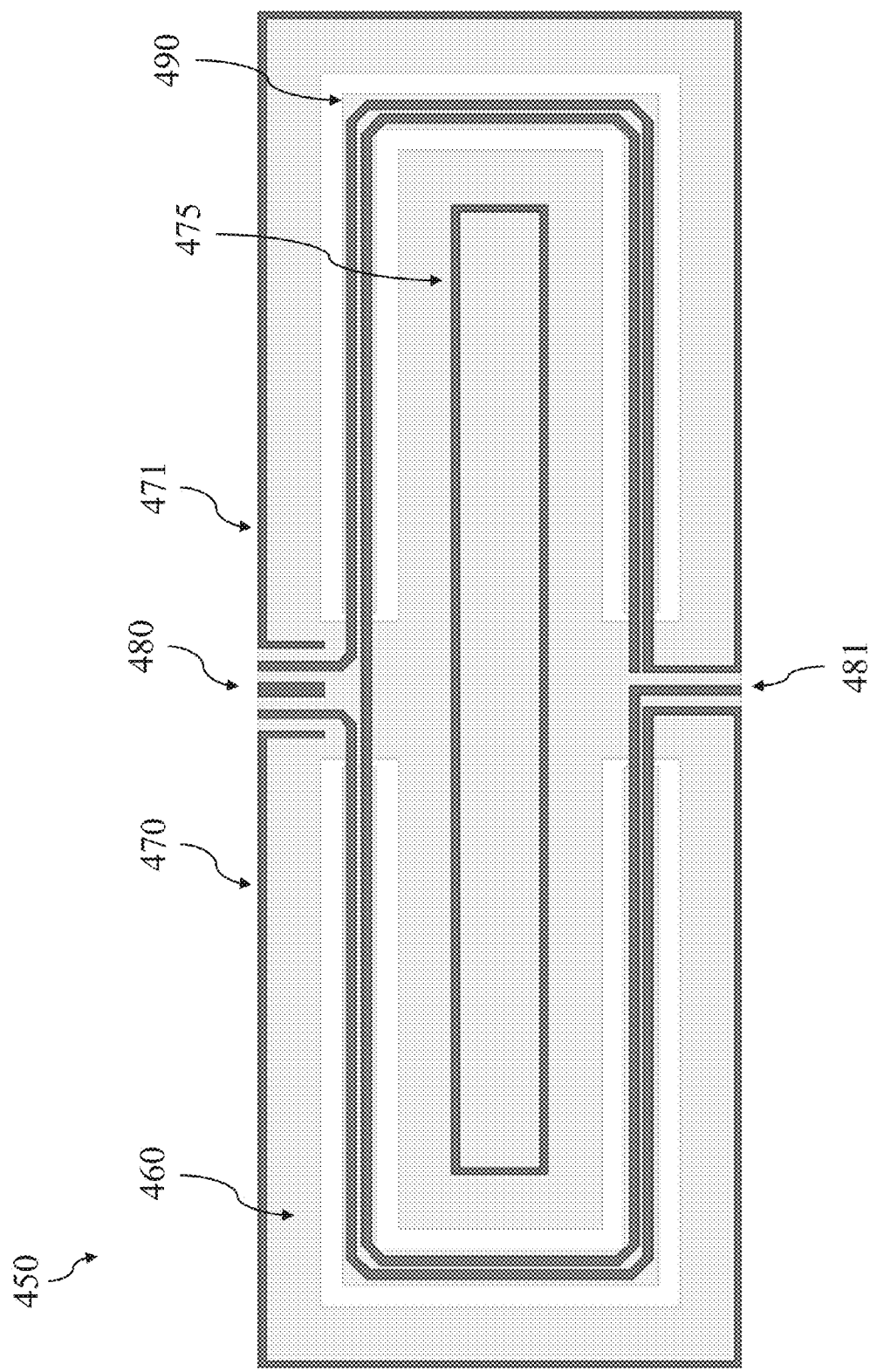
FIG. 4B illustrates a top view of a planar Marchand transmission line structure, according to an embodiment of the present invention.

FIG. 4B illustrates a top view of a planar Marchand transmission line structure 450, according to an embodiment of the present invention. The device has a differential port 480 having two λ/4 lines and a single-ended port 481 having a λ/2 line. Under the structure, there is a ground plane (MQ) 460. Also, there is a floating plane 490 under the most of the inner side shield 475. Finally, there are the outer side shields 470, 471.

Figure 5:
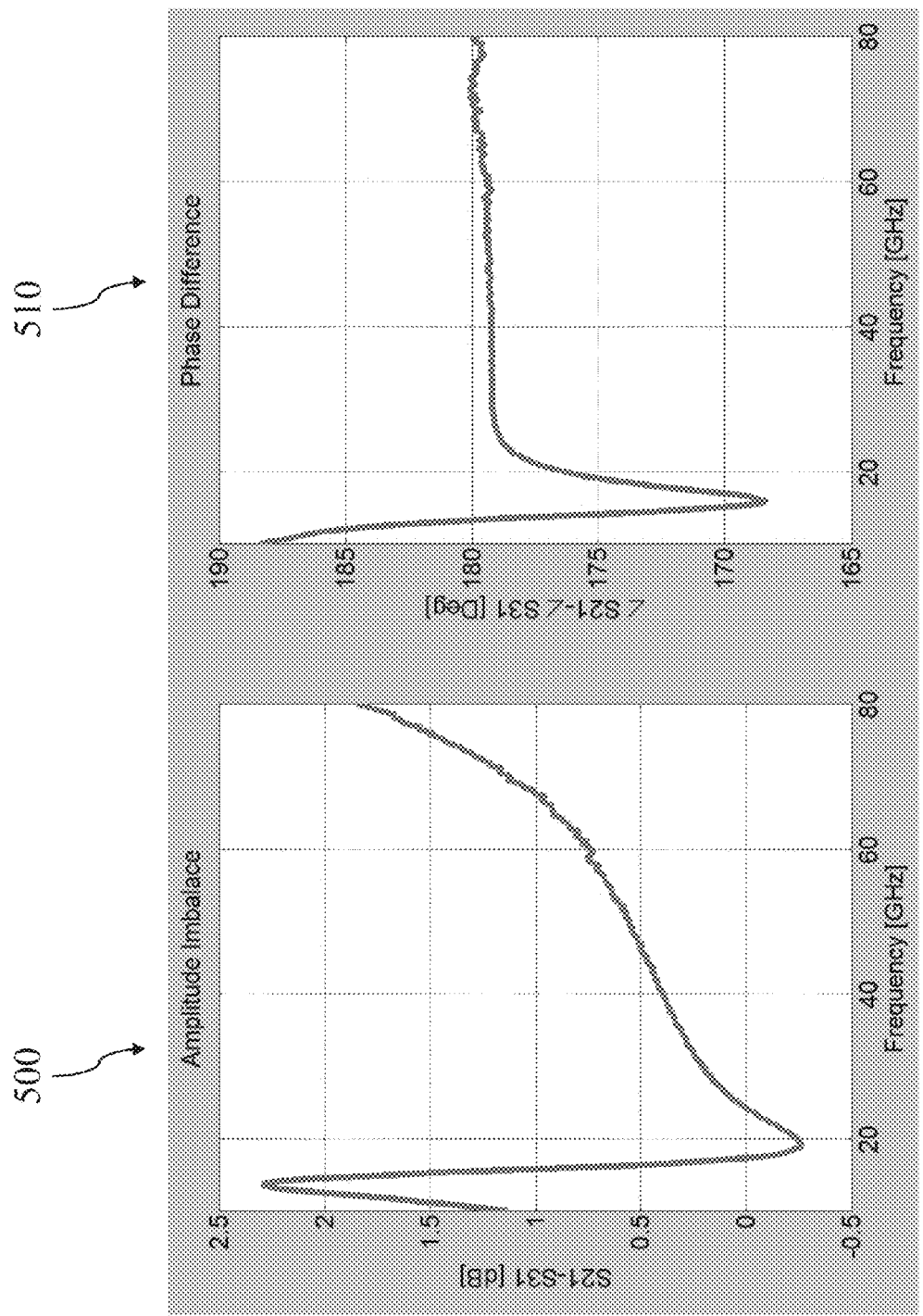
FIG. 5 shows an amplitude imbalance plot and a phase difference plot of the Marchand transmission line structure, according to an embodiment of the present invention.

FIG. 5 shows an amplitude imbalance plot 500 and a phase difference plot 510 of the Marchand balun transmission line structure, according to an embodiment of the present invention. The amplitude imbalance plot 500 shows the difference between the S21 and S31 S-parameters versus frequency across the 10 to 80 GHz range. Similarly, the phase difference plot 510 shows the difference in angle between the S21 and S31 S-parameters. It is observed that the balun operates over a wide frequency range, with close to 180 degree phase difference (e.g. 179-180 degrees) between the balun output ports (i.e. port 2 and port 3) from 25 GHz up to 80 GHz. The amplitude difference between the output ports is smaller than 2 dB over this frequency range.

Figure 6:
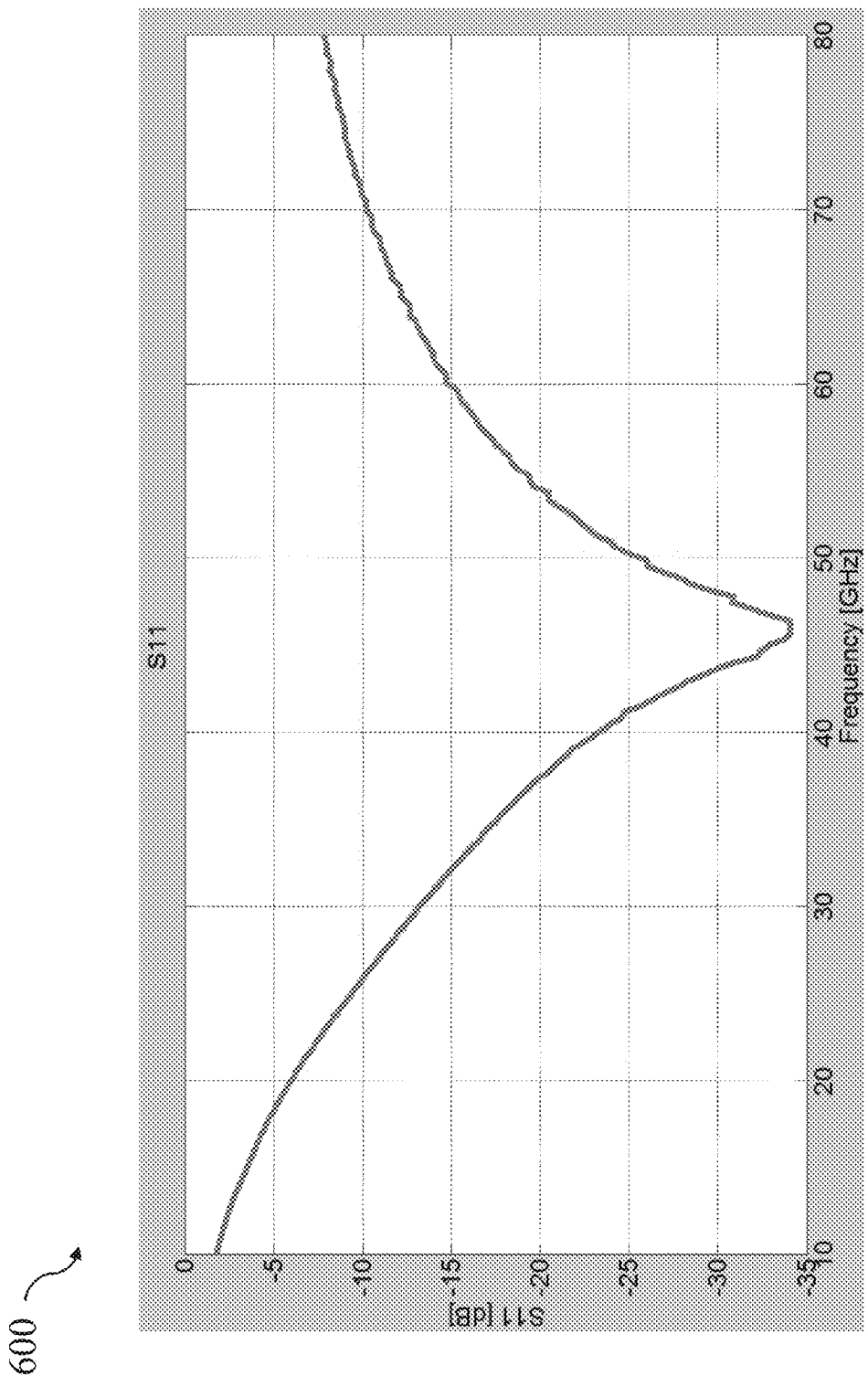
FIG. 6 shows the S11 S-parameter plot of the Marchand transmission line structure, according to an embodiment of the present invention.

FIG. 6 shows the S11 S-parameter plot 600 of the Marchand balun transmission line structure, according to an embodiment of the present invention. The S11 S-parameter plot 300 shows the reflected power from the input port (i.e., port 1) versus frequency across the 10 to 80 GHz range. It is observed that there is good matching at the input port over a wide frequency range, having S11 smaller than −10 dB from 25 GHz to 70 GHz.

Various embodiments of the invention may also be implemented in line couplers, hybrid couplers, lange couplers, parallel coupled line filters etc. These structures have a high even mode impedance that causes poor matching in even-mode.

While the foregoing written description of the invention enables one of ordinary skill to make and use what is considered presently to be the best mode thereof, those of ordinary skill will understand and appreciate the existence of alternatives, adaptations, variations, combinations, and equivalents of the specific embodiment, method, and examples herein. Those skilled in the art will appreciate that the within disclosures are exemplary only and that various modifications may be made within the scope of the present invention. In addition, while a particular feature of the teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the teachings disclosed herein. The invention should therefore not be limited by the described embodiment, method, and examples, but by all embodiments and methods within the scope and spirit of the invention. Accordingly, the present invention is not limited to the specific embodiments as illustrated herein, but is only limited by the following claims.

What is claimed is:

1. An apparatus comprising:
   a first ground plane;
   a set of signal lines comprising a positive signal line and a negative signal line; and
   a first floating plane between the signal lines and the first ground plane, wherein the first floating plane is configured to provide an even mode impedance of the signal lines that is higher than an odd mode impedance of the signal lines.

2. The apparatus of claim 1, wherein the positive signal line, the negative signal line, and the first floating plane are configured to create a cross parasitic capacitance at an odd mode.

3. The apparatus of claim 1, further comprising a grounded side shield line that is coplanar with the positive signal line.

4. The apparatus of claim 1, further comprising a silicon substrate layer below the first ground plane.

5. The apparatus of claim 1, wherein the set of signal lines comprises copper.

6. The apparatus of claim 1, further comprising a dielectric substrate between the first ground plane and the set of signal lines.

7. The apparatus of claim 6, wherein the dielectric substrate is selected from the group consisting of ceramic, plastic, polymer, and synthetic fiber.

8. The apparatus of claim 1, further comprising a second ground plane above the set of signal lines and a second floating plane between the set of signals line and the second ground plane.

9. An apparatus comprising:
   a differential transmission line comprising a positive signal line, a negative signal line, and a ground plane; and
   a floating plane coplanar with the ground plane, wherein the floating plane is configured to provide an even mode impedance of the differential transmission line that is higher than an odd mode impedance of the differential transmission line.

10. The apparatus of claim 9, wherein the positive signal line, the negative signal line, and the floating plane are configured to create a cross parasitic capacitance at an odd mode.

11. The apparatus of claim 9, further comprising at least one side shield line that is coplanar with the positive signal line.

12. The apparatus of claim 9, further comprising a silicon substrate layer below the ground plane.

13. A balun comprising:
   a substrate layer;
   a ground plane formed on a first surface of the substrate layer;
   a set of signal lines comprising a first signal line having a first end connected to a first port and second end connected to a second port, a second signal line having a third end connected to the ground plane a second port and a fourth end connected to the ground plane, and a third signal line having a fifth end connected to the ground plane and a sixth end connected to a third port; and
   a floating plane located between the set of signal lines and the ground plane, wherein the floating plane is configured to provide an even mode impedance of the signal lines that is higher than an odd mode impedance of the signal lines.

14. The balun of claim 13, wherein the second signal line and third signal line are substantially coplanar.

15. The balun of claim 13, further comprising a silicon substrate layer below the ground plane.

16. The balun of claim 13, wherein the set of signal lines comprises copper.

17. The balun of claim 13, further comprising a dielectric substrate between the first ground plane and the set of signal lines.

18. The balun of claim 13, wherein the dielectric substrate is selected from the group consisting of ceramic, plastic, polymer, and synthetic fiber.

19. The balun of claim 13, wherein the set of signal lines and the floating plane are configured to create a cross parasitic capacitance at an odd mode.

* * * * *